United States Patent [19]
Helot

[11] Patent Number: 5,717,571
[45] Date of Patent: Feb. 10, 1998

[54] MECHANISM LOCKING REMOVABLE MODULE INTO COMPUTER

[75] Inventor: Jacques H. Helot, Corvallis, Oreg.

[73] Assignee: Hewlett-Packard Company, Palo Alto, Calif.

[21] Appl. No.: 700,649

[22] Filed: Aug. 14, 1996

[51] Int. Cl.⁶ .............................. G06F 1/16; H05K 7/10; H01R 13/62
[52] U.S. Cl. .................. 361/685; 361/726; 361/732; 439/345; 439/372
[58] Field of Search ..................... 439/345, 372; 364/708.1; 361/683–686, 725–727, 732, 740, 759, 801

[56] References Cited

U.S. PATENT DOCUMENTS

| | | | |
|---|---|---|---|
| 5,311,455 | 5/1994 | Ho | 364/708.1 |
| 5,331,506 | 7/1994 | Nakajima | 361/686 X |
| 5,601,349 | 2/1997 | Holt | 439/345 X |

*Primary Examiner*—Michael W. Phillips

[57] ABSTRACT

A removable door locks a removable modular unit into place within a computer case. The computer case includes a first opening and a second opening. The door fits into the first opening. The modular unit fits into the second opening to be positioned, when inserted, adjacent to the door. The door has a protrusion extending into the first opening toward the modular unit. The door is inserted within the first opening in either a first orientation or a second orientation. When inserted in the first orientation, the protrusion extends into a recess within the modular unit blocking removal of the modular unit. When inserted in the second orientation, the protrusion still extends into the first opening, but does not mate to the recess. Thus, the modular unit is not blocked by the protrusion and can be removed from of the computer case through the second opening.

12 Claims, 4 Drawing Sheets

MECHANISM LOCKING REMOVABLE MODULE INTO COMPUTER

BACKGROUND OF THE INVENTION

This invention relates generally to computer system and notebook computer housings, and more particularly to mechanisms for securing modular subsystem units into a computer system or notebook computer.

The personal computer and computer work station are popular computer system architectures available in many different configurations having any of several different processors (e.g., 80386, 80486, 586, PENTIUM™, PowerPC™, Alpha) and operating systems (e.g., DOS, Windows 95, Windows NT, UNIX, MAC-OS, OS/2). Different categories by case size, include desktop computer, laptop computer, notebook computer and palm-top or hand-held computer. The laptop, notebook, and palm-top or hand-held computers also are referred to as portable computers. Typical components in each configuration include a housing, a motherboard, a display, a keyboard, and memory. Internally housed or external peripheral units also are common. Popular internal peripheral units include a hard disk drive, optical disk drive; floppy disk drive, tape drive, memory card, and fax/modem.

A portable computer is a popular configuration enabling increased mobility of a user. A conventional notebook computer, for example, is approximately the size of a standard sheet of paper, (e.g., 21.6 cm by 27.9 cm; or in English units –8.5 inches by 11.0 inches). The thickness of such a notebook computer typically is 4.5 cm to 6.0 cm.

One of the primary considerations in constructing a portable computer is to make the computer light enough and small enough to increase transportability, yet still maintain a desired level usability. The weight and size restrictions, however, typically impose a limit on the number of modules (e.g., peripheral devices) that can be included with the portable computer. Correspondingly, the capabilities and performance of the portable computer often are limited relative to a desktop computer.

Because there are so many differing uses for the computer it typically is too costly and inefficient to incorporate all the popular modules into a personal computer. For example, some users might require mass storage devices such as optical disk drives, while other instead might only need a hard disk drive or only a floppy disk drive. Also, it is common for companies to own a limited number of notebook computers which are checked out for use during travel or other out of office business operations. Due to the differing needs of the persons using the computer, it is desirable to configure the notebook computer with different modules for different users. Accordingly, there is a need for easy removal and insertion of modular units into and out of a notebook computer case.

In corporate environments the software pre-loaded onto the hard drive of a notebook computer may be partially or completely erased by the people in the company. Software specific to the company then is to be loaded onto the hard drive. Thus, easy insertion and removal of the hard drive is desired to facilitate the software installation process. Once configured to the company requirements, the computer is then delivered to an end user.

A common usage pattern is to use a portable computer with a docking station. Another usage pattern is to use a desktop computer as one's primary computer and to use a notebook computer when travelling or otherwise away from the office. Such a usage pattern poses a challenge to the maintenance of current data. Typically, data has to be downloaded from the desktop computer to the notebook computer before using the notebook computer. Once returning to the office, the data has to be uploaded back to the desktop computer. One solution referred to as data synchronization performs such task automatically. Such feature is common for personal information management software applications. Another solution is to use transportable storage media for one's primary storage device. Removable hard disk drives, optical drives, magneto-optical drives, and floppy disk drives are becoming more common alternatives for a notebook computer. Removable drives reemphasizes the need for easy removal and insertion of modular units into and out of a notebook computer or other portable or desktop computer case.

Other factors supporting the need for easy removal and insertion of modular units include inadequate capacity of a single hard drive. For some user the capacity of one hard disk drive may not be enough. If they have information stored on multiple hard disk drives, there is a need to be able to swap hard disk drives within a given notebook computer case.

While many factors exist for supporting the easy removal and insertion of modular units such as hard drives, there are also factors that support the difficult removal and insertion of modular units such as hard drives. For example, theft of valuable data on a notebook computer is a large and growing problem, and an easily removable hard drive can facilitate this theft, even if the notebook computer itself is secured to a stationary object via a Kensington℧ lock or similar device. In addition, some corporate environments would prefer that its employees not tamper with removable modular units such as hard drives, since this makes inventory control and system and network management a more difficult process to handle. Once again, an easily removable hard drive can facilitate this tampering.

In the past, computer manufacturers were forced to choose between making it either difficult or easy to remove modular units such as disk drives in their computers. This choice invariably left some users pleased, but other users were unhappy that their computer did not meet their needs.

SUMMARY OF THE INVENTION

According to the invention, a mechanism is provided for locking or unlocking of a modular unit within a computer case. The computer case includes a first opening and a second opening. The mechanism fits into the first opening. The modular unit fits into and is removed via the second opening. While inserted, the modular unit resides adjacent to the mechanism and first opening.

According to one aspect of the invention, the mechanism is a removable door having a protrusion extending into the first opening toward the modular unit.

According to another aspect of the invention, the door is inserted in either a first orientation or a second orientation. When inserted at the first orientation the protrusion in the door extends into a recess within the modular unit blocking removal of the modular unit. When inserted at the second orientation, the protrusion still extends into the first opening, but does not mate to the recess. Thus, the modular unit is not blocked by the protrusion and is able to be slid into or out of the computer case through the second opening.

According to an embodiment of the invention, the removable door includes a body having an area the size of the first opening. The door also includes at least two fingers extending from the body for securing the door to the computer case.

At least one finger is bendable. The protrusion extends from a first location on the body into the first opening of the computer case. The door body has a symmetrical shape, and the fingers are symmetrically positioned about the body. One finger secures to a first edge of the first opening when the door is at the first orientation. Another finger secures to the first edge when the door is at the second orientation. Such one finger secures to a second edge of the first opening when the door is at the second orientation. Such other finger secures to the second edge when the door is at the first orientation.

In some embodiments either one or both of the fingers extend beyond the first opening area in addition, the protrusion is rigid and formed integrally to the body so as to be fixed at a position on the body while the door is at either of the first and second orientations.

According to another aspect of the invention, the mechanism is used to perform a method for locking and unlocking a removable modular unit into a computer case having a first opening and a second opening. The mechanism is embodied by a removable door securing to the first opening. The modular unit is removable via the second opening while unlocked. The method includes, for locking the modular unit, the step of securing the door to the first opening at a first orientation of the door in which the door protrusion blocks the modular unit from being removed through the second opening. The method includes, for unlocking the modular unit, the step of securing the door to the first opening at a second orientation of the door in which the modular unit is capable of being removed from the computer case via the second opening.

According to another aspect of the invention, a computer system is provided which includes a computer case, a removable modular unit and a removable door. The computer case has a first opening and a second opening. The modular unit is insertable into the computer case and removable out of the computer case via the second opening. The door covers the first opening adjacent to the modular unit. The door is removably secured to the computer case. The door includes a body having an area encompassing the size of the first opening, and a protrusion extending from a first location on the body into the first opening. The door fits to the first opening at a first orientation in which the protrusion locks the removable modular unit into the computer case. The door also fits to the first opening at a second orientation in which the modular unit is capable of being removed from the computer case via a second opening in the computer case.

One advantage of the invention is that the door is installed whether or not the modular unit is locked or unlocked. This avoids the need to externally store any parts while the modular unit is unlocked. Another advantage of the invention is that some door embodiments are formed in one piece. This reducing the number of components, and makes losing parts less likely. Another advantage of the invention is that the door provides a minimal level of security preventing the inadvertent removal of a modular unit. These and other aspects and advantages of the invention will be better understood by reference to the following detailed description taken in conjunction with the accompanying drawings.

DESCRIPTION OF SPECIFIC EMBODIMENTS

Overview

Figure 1:
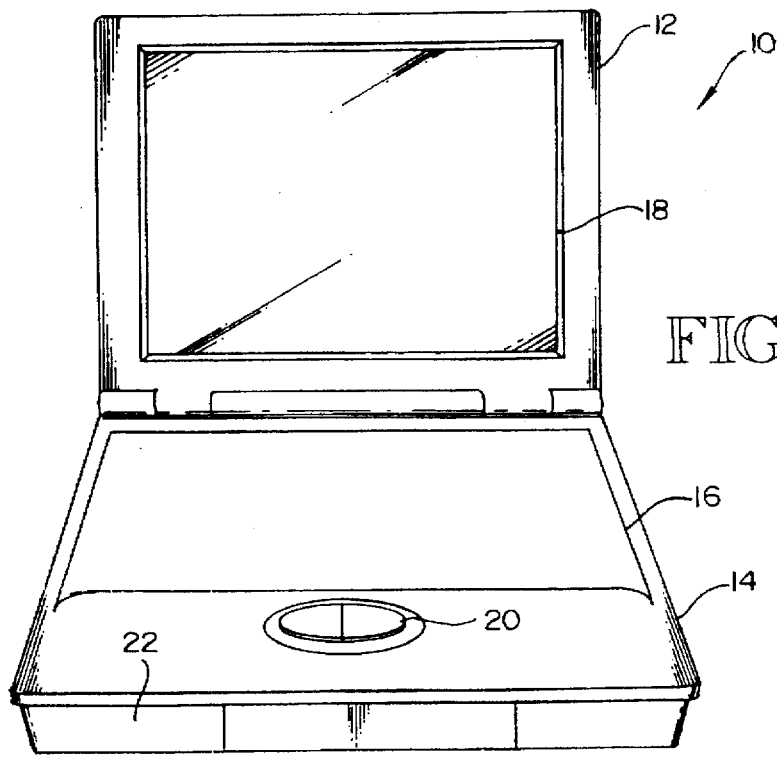
FIG. 1 is a perspective view of a notebook computer according to an embodiment of this invention.

FIG. 1 shows a perspective view of a notebook computer 10. The notebook computer 10 includes a display screen housing 12 hinged to a keyboard housing 14. The display screen housing 12 folds down against a keyboard 16 where the two housings 12, 14 latch together. A flat panel display 18 is mounted to the display screen housing 12. The keyboard 16 and a input device 20 are mounted to the keyboard housing 14. A processor board (not shown) is mounted within the keyboard housing 14 beneath the keyboard 16. A removable modular unit 22 also is mounted to the keyboard housing 14. In various embodiment, the modular unit 22 is a hard disk drive, an optical disk drive, a floppy disk drive, magneto-optical disk drive or other removable storage media drive unit.

Figure 2:
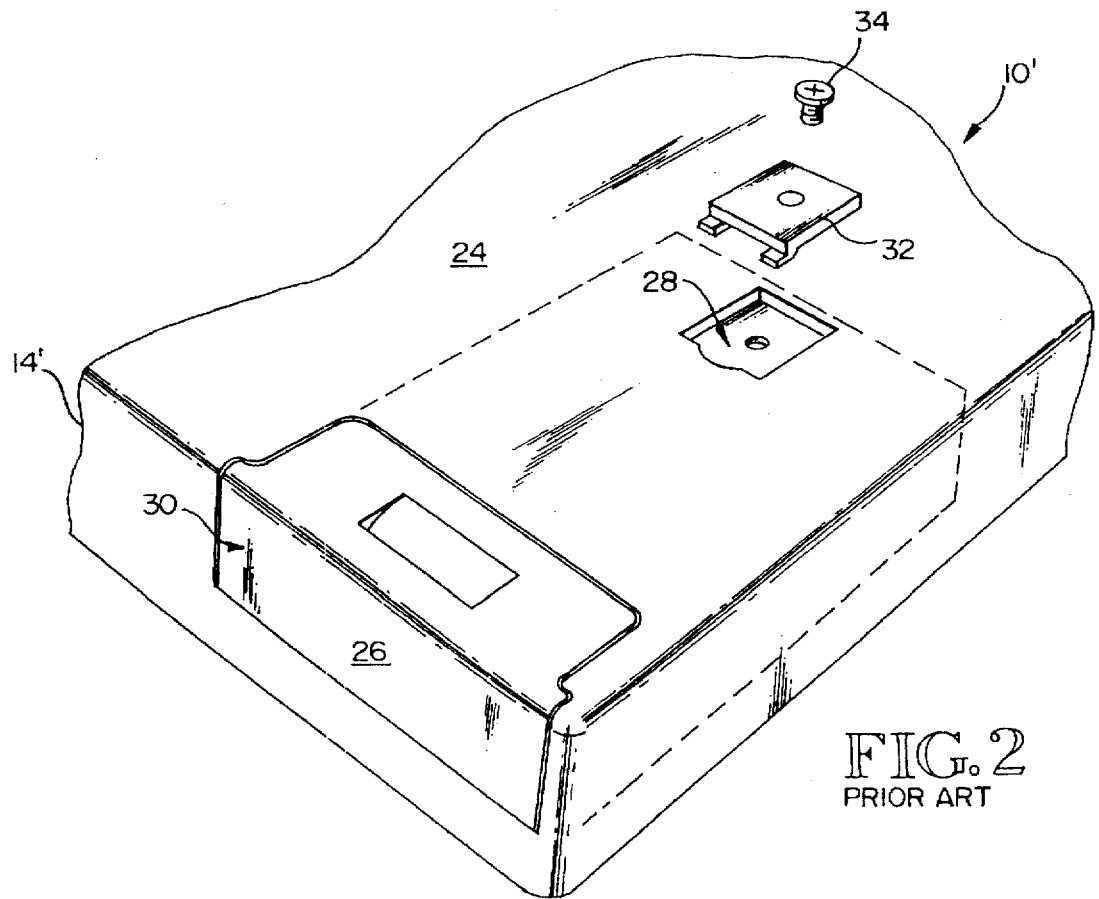
FIG. 2 is a planar bottom view of a conventional notebook computer having a removable hard disk drive.
Figure 3:
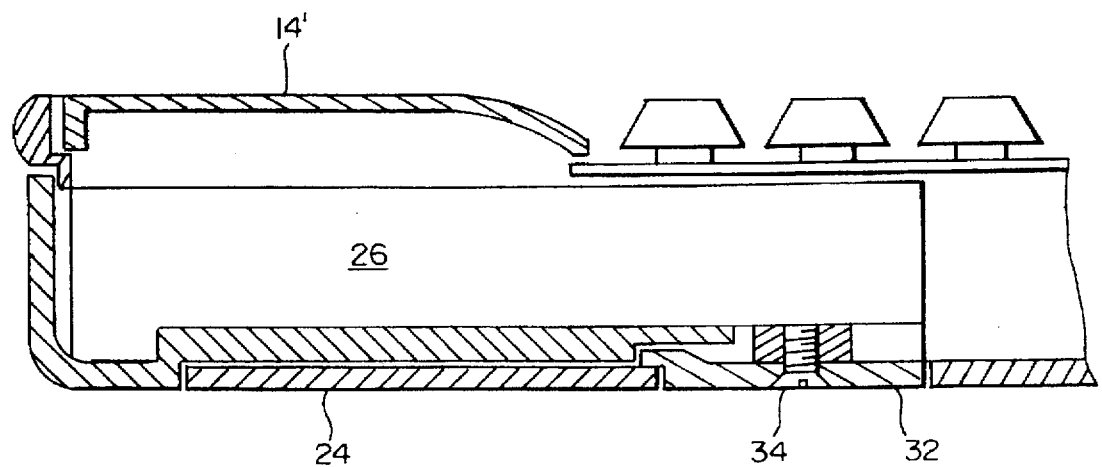
FIG. 3 is a cutaway view of a conventional mechanism for locking a modular unit into the notebook computer of FIG. 2.

FIG. 2 shows the underside 24 of a keyboard housing 14' for a conventional notebook computer 10' having a removable hard disk drive 26. The housing 14' has a first opening 28 and a second opening 30. A door 32 fits into the first opening 28 adjacent to the hard disk drive 26. With the door 32 removed the hard disk drive 26 is pulled through the second opening 30 to remove the hard disk drive 26 from the keyboard housing 14'. FIG. 3 shows a view of the conventional notebook computer of FIG. 2 with the door 32 and hard disk drive 26 inserted. A screw 34 fastens the door to the hard disk drive 26 locking the door onto the keyboard housing 14 and preventing the hard disk drive 26 from being removed from the keyboard housing 14. A disadvantage to the door 32 and screw 34 combination is that the combination only has one installed position. Such installed position locks the hard disk drive 26 into place. If it were desirable to have the hard disk drive 26 installed without being locked in place, then the door 32 and screw 34 need to be detached. While detached the hard disk drive 26 is exposed through the first opening 28. More significantly, however, the door 32 and screw 34 have to be stored separately, and thus are more likely to be lost or misplaced.

Door Mechanism

Figure 4:
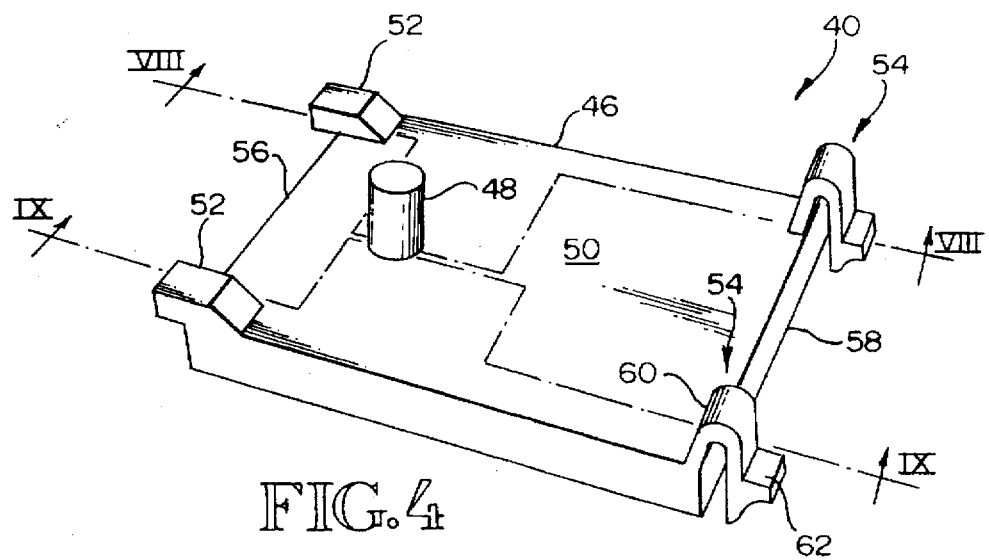
FIG. 4 is a perspective view of a removable door mechanism according to an embodiment of this invention.

FIG. 4 shows a door mechanism 40 according to an embodiment of this invention. The door mechanism 40 avoids the disadvantages of the conventional door 32/screw 34 combination of FIGS. 2 and 3. The door 40 fits to a first opening 42 (see FIG. 5) in the underside 44 of the notebook computer 10 of FIG. 1. The door 40 has a shape conforming to the size of the first opening 42 and is contoured to conform to the contour and styling of the keyboard case 14 in the vicinity of the first opening 42. In an exemplary embodiment the door 40 and keyboard housing 14 are made of a hard plastic material.

The door 40 has a main body 46. The body 46 has an area fitting to the area of the first opening 42. A post, wall or other protrusion 48 extends from an undersurface 50 of the door body 46. When installed the protrusion 48 extends into the first opening 42. The protrusion 48 is located at a fixed position on the door 40 and does not move relative to the door 40. Preferably the protrusion 48 is formed integrally to the door body 46.

In one embodiment the door body 46 has a rectilinear shape defining a first edge 56 and an opposite second edge 58. The door 40 also includes a plurality of fingers 52, 54. A pair of rigid fingers 52 extend from the door body 46 beyond the first edge 56. A pair of bendable fingers 54 extend from the door body 46 beyond the opposite second edge 58. Although the fingers 52 are described as being rigid, in alternative embodiments the fingers 52 are resilient or bendable. Although a pair of fingers 52 are shown, in alternative embodiments there are one or more fingers 52. The length, width and shape of fingers 52 also may vary from those illustrated. In one embodiment having a single finger 52, the finger 52, for example, spans anywhere from a small proportion of the edge 56 up to the entire edge 56. Similarly, although the fingers 54 are described as being bendable, in alternative embodiments the fingers 54 are rigid. Although a pair of fingers 54 are shown, in alternative embodiments there are one or more fingers 54. The length, width and shape of fingers 54 also may vary from those illustrated. In one embodiment having a single finger 54, the finger 54, for example, spans anywhere from a small proportion of the edge 56 up to the entire edge 56.

In the FIG. 4 embodiment, each bendable finger 54 defines a hook portion 60 and an extension portion 62. The finger 54 is formed of the same material as the body 46, but has less thickness allowing the hook portion to bend. When bent inward toward the body 46, the hook portion 60 varies the distance that the extension portion 62 extends beyond the second edge 58.

The fingers 52, 54 serve to secure the door 40 to the keyboard housing 14 at the first opening 42. In alternative embodiments, other structures for securing the door are used in place of the fingers 52, 54. Alternative ways of securing the door include hook and loop fasteners such as VELCRO, snaps, latches, an elastic strap, a magnet, non-drying adhesive or another fastening, adhering or attaching devices for securing the door 40 to the housing 14 at the first opening 42. In one alternative embodiment an elastic cord couples the door 40 to the computer case allowing the door to be pulled away from the case enough for a user to reverse the door's orientation.

Computer Case and Modular Unit

Figure 5:
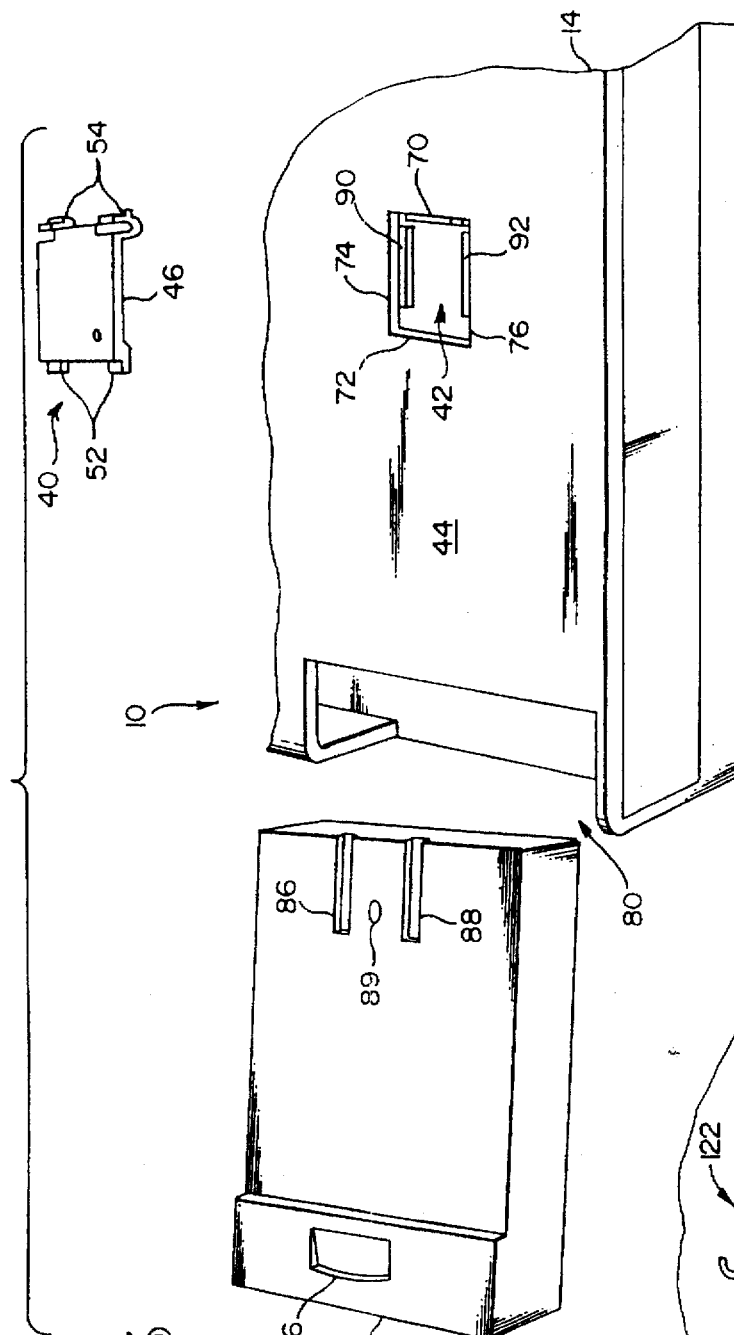
FIG. 5 is an exploded view of a removable modular unit, door mechanism and part of a computer case for the notebook computer of FIG. 1 according to an embodiment of this invention.
Figure 7:
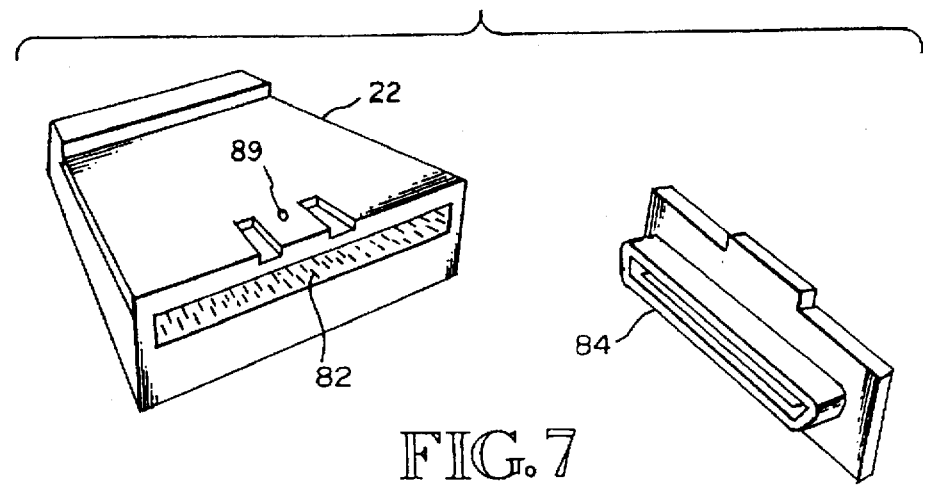
FIG. 7 is a perspective view of the modular unit of FIG. 5 and edge connector of FIG. 6.

FIG. 5 shows the modular unit 22 and door 40 removed from the computer case (e.g., keyboard housing 14). The keyboard housing 14 includes the first opening 42 and a second opening 80. The modular unit 22 slides into the second opening 80. Referring to FIG. 7, the modular unit includes an edge connector 82 for mating to another edge connector 84 mounted within the keyboard housing 14. The connection establishes electrical communication between the modular unit 22 and the computer's processor board and other computer circuitry (typically via a bus). With the modular unit 22 inserted, the unit 22 is visible through the first opening 42.

Figure 6:
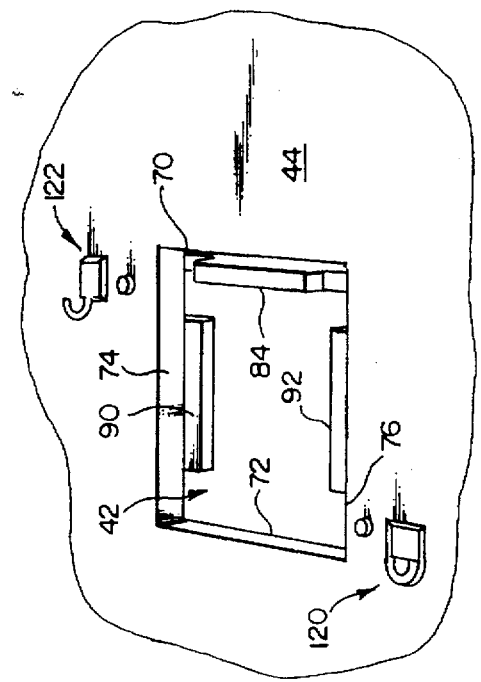
FIG. 6 is a perspective View of the door opening in the computer case of FIG. 5.

The door 40 fits to the first opening 42 covering the exposed modular unit 22. In some embodiments the modular unit 22 defines one or more grooves 86, 88 to provide space for the door fingers 52, 54 to fit between the modular unit 22 and the keyboard housing 14. The modular unit 22 also defines an opening, indentation or recess 89 at which the door protrusion 48 is to be received. Referring to FIG. 6, the keyboard housing 14 defines the first opening 42 with surface edges 70, 72, 74, 76. Along two edges 74, 76 supports 90, 92 are mounted or formed. The door 40 rests on the supports 90, 92 while installed. Although the first opening is shown having a rectangular shape, the shape may vary. Preferably the shape is symmetrical enabling the door 40 to be inserted at differing orientations. The door 40 has a shape corresponding to the first opening 42.

Locked and Unlocked Orientations

Figure 8:
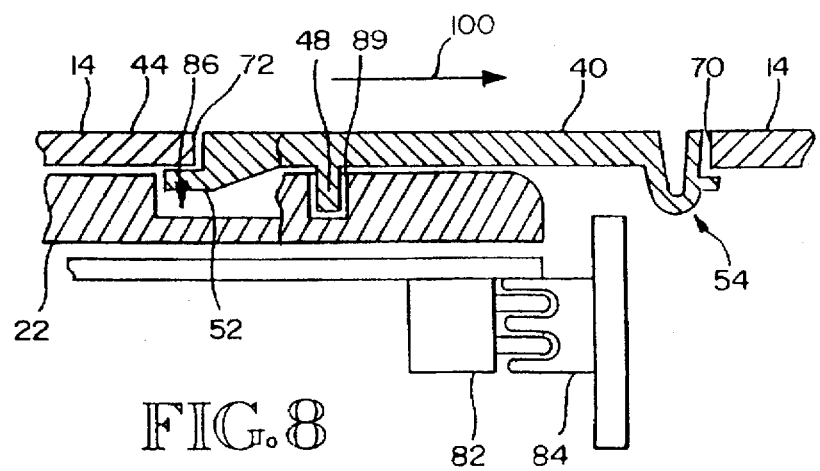
FIG. 8 is a partial cutaway view of the notebook computer of FIGS. 1 and 5 showing the door in the locked orientation and being cutaway along sectional line VIII—VIII of FIG. 4.
Figure 9:
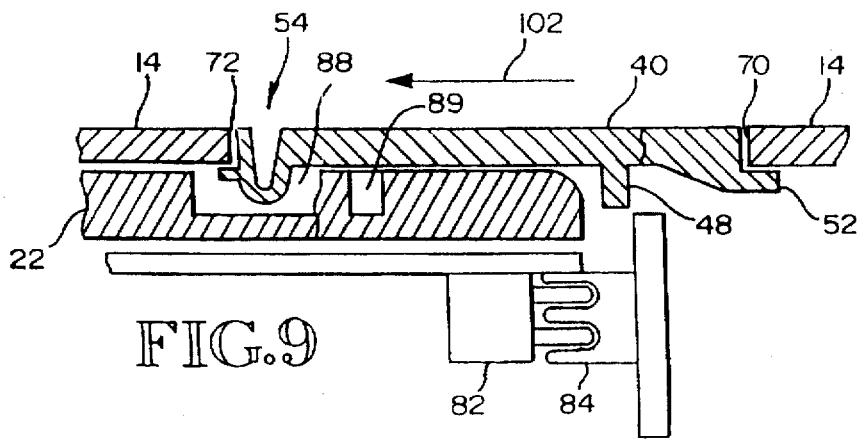
FIG. 9 is a partial cutaway view of the notebook computer of FIGS. 1 and 5 showing the door in the unlocked orientation and being cutaway along sectional line IX—IX of FIG. 4.

The door 40 fits to the first opening 42 in either of two orientations. Oriented in a first direction 100 (see FIG. 8) relative to the keyboard housing 14, the door 40 locks the modular unit 22 into place preventing its removal. Oriented in a second direction 102 (see FIG. 9) relative to the keyboard housing 14, the door 40 defines an unlocked position in which the modular unit 22 is removable via the second opening 80. Prior to inserting the door 40, a modular unit 22 typically is first inserted into the keyboard housing second opening 80.

To insert the door 40 into the first opening, the fingers 52 are slid under the keyboard housing 14 at the first opening 42. When inserting the door 40 while oriented in the first direction 100, the fingers 52 are placed under the surface 44 of keyboard housing 14 at edge 72. The door 40 then is rotated to bring the bendable fingers 54 adjacent to the keyboard housing edge 70. To close the door 40, the rotation of the door 40 is continued. The Force on the door 40 as the bendable fingers 54 contact the edge 70 cause the fingers 54 hook portions 60 to bend. With the hook portions 60 bent the extension portions 62 fit within the first opening 42. Once the keyboard housing 14 is cleared the compressive force on the hook portions 60 go away. The hook portions 60 return to their relaxed state moving the extension portions 62 beyond the area of the first opening. The keyboard housing 14 isolates the extension portion 62 from the external environment. With the door 40 installed the fingers 52 and 54 extend beyond the area of the first opening 42 securing the door to the keyboard housing 14.

As the door 40 is inserted into the first opening 42 while oriented along the first direction 100, the door protrusion 48 mates to an opening, recess or indentation 89 in the modular unit 22. The recess 89 limits the protrusion 48 on at least one side so as to prevent substantial movement of the modular unit 22 in a direction outward from the second opening 80. Preferably the protrusion 48 and recess 89 define respective surfaces perpendicular to the direction For moving the modular unit 22 into and out of the second opening 80. Such surface relationship prevents the modular unit 22 from popping the door 40 open if force is applied to pull the modular unit outward from the second opening 80. Instead, the modular unit 22 is locked into the second opening 80 unable to be pulled from the keyboard housing 14.

To remove the door 40 one uses a fingernail or tool to compress the bendable fingers 54 a sufficient mount for the extension portions 62 to clear the keyboard housing 14. While the extension portions 62 are cleared of the housing 14, the door 40 is rotated away from the housing 14. The door then is pulled away from the first opening 42.

When inserting the door 40 oriented in the second direction 102 so as to define an unlocked position, the fingers 52 are placed under the surface 44 of keyboard housing 14 at edge 70. The door 40 then is rotated to bring the bendable fingers 54 adjacent to the keyboard housing edge 72. To close the door 40, the rotation of the door is continued. The force on the door 40 as the bendable fingers 54 contact the edge 72 cause the fingers 54 hook portions 60 to bend. With the hook portions 60 bent the extension portions 62 fit within the first opening 42. Once the keyboard housing 14 is cleared, the compressive force on the hook portions 60 go away. The hooked portions 60 then return to their relaxed state moving the extension portions 62 beyond the area of the first opening 42. The keyboard housing 14 then isolates the extension portions 62 from the external environment. With the door 40 installed the fingers 52 and 54 extend beyond the area of the first opening 42 securing the door to the keyboard housing 14. With the door oriented along the second direction 102, the protrusion 48 does not mate to the modular unit recess 89. Instead the protrusion 48 extends into the first opening 42 to an area beyond the length of the modular unit 22. Thus, the modular unit is not blocked by the protrusion 48 and can be removed via the second opening 80. In an alternative embodiment, the protrusion 48 extends to the modular unit 22 (instead of beyond the modular unit). Such embodiment of the modular unit 22, however, does not bound the protrusion 48 in a direction which would prevent movement of the modular unit 22 outward from the second opening 80. Thus, the modular unit 22 is capable of being removed via the second opening 80 without interference from the door protrusion 48.

For ease of use, the keyboard housing 14 in some embodiments includes markings 120, 122 (see FIG. 6) for indicating the door orientation which locks the modular unit in place and the door orientation which does not lock the modular unit in place. It is desirable to secure the door 40 in either orientation 100, 102 because users may prefer not to lock the modular unit 22 into place. In such case, the door 40 is still attached and need not be stored separately. This avoids misplacement or loss of the door 40. Preferably the edge connectors 82, 84 provide sufficient resistance to keep the modular unit in place when the modular unit is not locked into position. To remove the modular unit 22 from the second opening while unlocked, a user pulls the modular unit so as to separate the edge connectors 82 and 84. The modular unit 22 then slides easily from the second opening 80. In some embodiments a groove 126 (see FIG. 5) is provided on the modular unit to ease the pulling of the unit through the second opening 80. In other embodiments the modular unit 22 clicks into place to keep the modular unit stable while the modular unit is not locked into position.

Although preferred embodiments of the invention has been illustrated and described, various alternatives, modifications and equivalents may be used. Therefore, the foregoing description should not be taken as limiting the scope of the inventions which are defined by the appended claims.

What is claimed is:

1. A method for locking and unlocking a removable modular unit into a computer case, the computer case having a first opening and a second opening, a removable door securing to the first opening, the modular unit removable via the second opening while unlocked, the removable door including a body having a body area encompassing an area of the first opening, a first finger extending from the body, a bendable second finger extending from the body; and a protrusion extending from a first location on the body into the first opening, the method comprising the steps of:

for locking the modular unit, securing the door to the first opening at a first orientation of the door in which the protrusion blocks the modular unit from being removed through the second opening; and for unlocking the modular unit, securing the door to the first opening at a second orientation of the door in which the modular unit is capable of being removed from the computer case via the second opening; and wherein the first finger and second finger secure the door to the computer case during the securing step for locking and during the securing step for unlocking.

2. The method of claim 1, in which one of the first finger and second finger secures to a first edge of the first opening when the door is at the first orientation and the other of the first finger and second finger secures to the first edge when the door is at the second orientation; and in which said one of the first finger and second finger secures to a second edge of the first opening when the door is at the second orientation and said other of the first finger and second finger secures to the second edge when the door is at the first orientation.

3. The method of claim 1, in which the protrusion is fixed at the first location on the body while the door is at the first orientation and while the door is at the second orientation.

4. A computer system, comprising:

a computer case having a first opening and a second opening:

a modular unit insertable into the computer case and removable out of the computer case via the second opening;

a removable door for covering the first opening, the first opening leading to the modular unit, the door comprising: a body having a body area encompassing an area of the first opening, and a protrusion extending from a first location on the body into the first opening; and means for securing the door to the computer case; and wherein the door secures to the first opening at a first orientation in which the protrusion locks the removable modular unit into the computer case and secures to the first opening at a second orientation in which the modular unit is capable of being removed from the computer case via the second opening in the computer case.

5. The system of claim 4, in which the door has a symmetrical shape.

6. The system of claim 4, in which the modular unit is one selected from the following group: a hard disk drive, a CD-ROM drive, a floppy disk drive, and a magneto-optical disk drive.

7. The system of claim 4, in which the protrusion is rigid and formed integrally to the body.

8. The system of claim 4, in which the protrusion is fixed at the first location on the body while the door is at the first orientation and while the door is at the second orientation.

9. The system of claim 4, in which the securing means comprises:

a first finger extending from the body;

a bendable second finger extending from the body, the second finger bending to facilitate insertion of the door into the first opening.

10. The system of claim 9, in which either one or both of the first finger and second finger extend beyond the first opening area.

11. The system of claim 9, in which one of the first finger and second finger secures to a first edge of the first opening when the door is at the first orientation and the other of the first finger and second finger secures to the first edge when the door is at the second orientation; and in which said one of the first finger and second finger secures to a second edge of the first opening when the door is at the second orientation and said other of the first finger and second finger secures to the second edge when the door is at the first orientation.

12. The system of claim 9, in which the first finger is one of a pair of first fingers, and in which the bendable finger is one of a pair of bendable second fingers;

in which the pair of first fingers are symmetrically positioned relative to the pair of second fingers about the body;

in which one pair of the pair of first fingers and the pair of second fingers secures to a first edge of the first opening when the door is at the first orientation and the other pair of the pair of first fingers and the pair of second fingers secures to the first edge when the door is at the second orientation; and in which said one pair of the pair of first fingers and the pair of second fingers secures to a second edge of the first opening when the door is at the second orientation and said other pair of the pair of first fingers and the pair of second fingers secures to the second edge when the door is at the first orientation.

* * * * *